United States Patent [19]
Ojha et al.

[11] Patent Number: 5,904,491
[45] Date of Patent: May 18, 1999

[54] PLANAR WAVEGUIDES

[75] Inventors: Sureshchandra Mishrilal Ojha, Harlow; Jonathan Paul Stagg, Sawbridgeworth, both of United Kingdom

[73] Assignee: Northern Telecom Limited, Quebec, Canada

[21] Appl. No.: 08/842,021

[22] Filed: Apr. 23, 1997

[30] Foreign Application Priority Data

Apr. 24, 1996 [GB] United Kingdom ............ 9608615

[51] Int. Cl.$^6$ ............ H01L 21/00; G02B 6/00
[52] U.S. Cl. ............ 438/31; 385/131; 385/132; 385/144
[58] Field of Search ............ 438/31; 385/130, 385/131, 132, 144

[56] References Cited

U.S. PATENT DOCUMENTS

| | | | |
|---|---|---|---|
| 5,243,677 | 9/1993 | Kanamori et al. | 385/130 |
| 5,408,569 | 4/1995 | Nishimoto | 385/132 |
| 5,519,803 | 5/1996 | Shiono et al. | 385/132 |
| 5,653,008 | 8/1997 | Sim et al. | 358/16 |

*Primary Examiner*—Brian Dutton
*Attorney, Agent, or Firm*—Lee, Mann, Smith, McWilliams, Sweeney & Ohlson

[57] ABSTRACT

A cladding layer on the core of an optical waveguide is subjected to a rapid thermal annealing process preferably either: in a multi-stage furnace in which the waveguide substrate can be transported rapidly on a carriage between stages at different temperatures; or in a quartz chamber adjacent a bank of quartz halogen lamps of low thermal inertia and easily switched rapidly between different intensities of thermal radiation through the chamber.

4 Claims, 4 Drawing Sheets

$O_2 N_2 H_a$

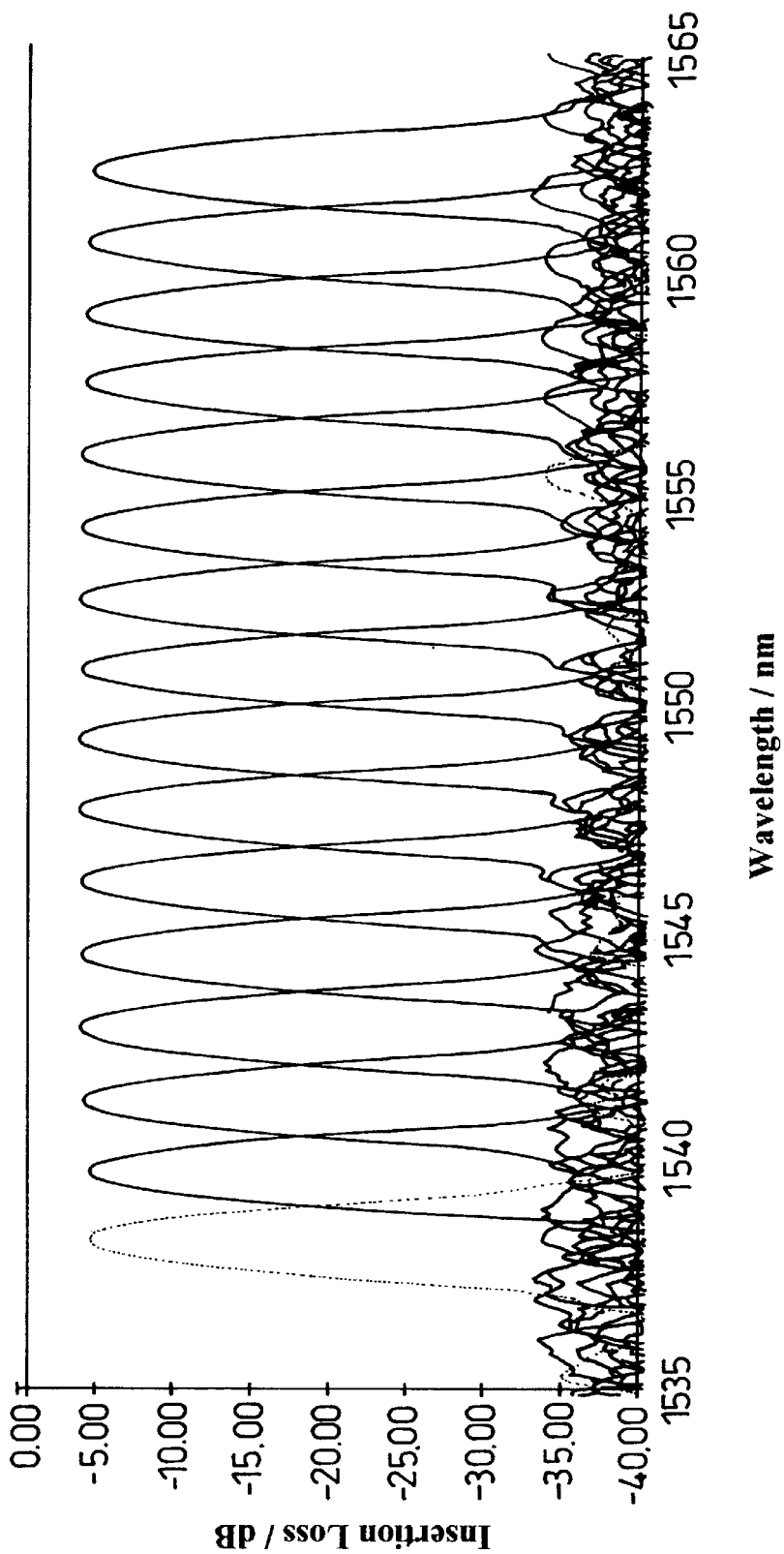

PLANAR WAVEGUIDES

The present invention relates to a wave guide and to a method of annealing a planar wave guide cladding deposited after the production of a buffer and a core, e.g. after a thick cladding layer has been produced on the buffer and core by a plasma enhanced chemical vapour phase deposition (PECVD) process.

BACKGROUND OF THE INVENTION

An annealing procedure in the production of a planar wave guide cladding can be critical because the precursor materials for the deposition, i.e. the plasma creating substances (typically hydrides and nitrous oxide), are liable to create unwanted chemical substances such as radicals with bonded hydrogen in the films. The annealing procedure may expel the undesired elements in such a combination, but the sites of the expelled elements are then likely to contain voids, gaps and other imperfections in the structure of a deposited wave guide layer. These imperfections may not only detract from the strength and dimensional predictability of a wave guide so treated, but may lead to inhomogenities in its refractive index, thus prejudicing its optical operation. Since a typical operating wavelength may be 1.55 microns, and the operation of a planar wave guide may depend on such small differences in refractive index as 0.7% between the cladding and the core and the buffer on which it rests, even minor errors in refractive index are unacceptable.

Annealing tends to reduce any imperfections, and to consolidate or density the material deposited by a PECVD process, but an annealing procedure can take a long time, and arrangements to be described below provide a reliable improvement in a structure without the employment of an unduly long annealing time. Previously proposed methods of annealing deposited layers, especially thick layers usually involved slow heating in attempts to avoid the disadvantage, even when layers are produced by means other than a PECVD process, of a tendency to cause stresses and cracking. The films deposited by PECVD, low pressure chemical vapour deposition (LPCVD) or by atmospheric pressure chemical vapour deposition (APCVD) are coherently bonded, hard and stable, unlike the films deposited by previous flame hydrolysis techniques which are soot-like, soft and porous. The properties of these PECVD, LPCVD or APCVD deposited films provide a reduced tendency to cracking or blistering during an annealing process. The cracking probably results from a physical mismatch between the wave guide core, its substrate, the intermediate buffer layer which is usually present, especially with thick films, and the deposited cladding. With a PECVD process, the precursor materials used are of such a nature, as explained above that they tend to add to the problems of annealing.

Many materials such as those of interest herein can also be deposited in layers by spin coating from liquid sources generally referred to as Solgel. Such a technique is described for example by R A A Syms and A S Holmes in *J. Non-crystalline Solids,* 170, 1994, pp. 223 to 233. However, the resulting layers are severely limited in thickness, and each layer may take three minutes or so to produce. Therefore there is no substantial advantage in techniques for their rapid annealing. With the more rapid PECVD process, need for rapid annealing is much more significant.

Fast rate annealing of very thick ($\geq 15$ micron) borophosphosilicate glass (BPSG) cladding layers which have been deposited using PECVD (the cladding oxide may be undoped or contain dopants such as germania) was carried out by first removing unstable products, such as bonded hydrogen and water vapours at low temperatures e.g. 700° C. and then step by step raising the temperature till the cladding layer fills up the gaps between and around the etched core layers. The annealing time and temperatures are determined by the composition of the cladding layer. Annealing temperature-time combination is critical for controlling all the requisites for a low loss cladding layer such as refractive index homogeneity across the thickness of the film, and also around the channel wave guides.

As an example, one prior proposed cladding process consists of depositing 1, 3, 6 and 6 microns thick BPSG film by PECVD. Each of the layers is separately annealed. This prior proposed annealing is carried out by slowly ramping a resistively heated furnace containing the wafers, from 300° C. to 1000 or 1050° C. The total time for annealing each layer is around 16 hours, thus making the total time of anneal for a 15 microns thick layer up to 64 hours. The slow ramping was believed to be necessary to prevent cracking or degradation of the film, which may occur if the film is suddenly exposed to temperatures close to the flow temperatures of the BPSG. Such long annealing times are undesirable for manufacturing of planar wave guide devices, as this will slow down the product throughput.

Rapid annealing of phosphosilicate and borophosphosilicate glasses for the purposes of integrated circuit application has been described for example by R Thakur et al. in Proceedings of 11th VMIC Conference, California, Jun. 7–8, 1994, pp 117 to 119. The glass film, typically $\leq 2$ microns in thickness in the case of IC technology is used as an interlayer dielectric where the key requirement of the material is its electrical insulation rather than any optical properties. In planar wave guide applications as envisaged herein, the glass thickness is not only significantly greater, typically $\geq 16$ microns, but the control of the refractive index of the film across the substrate, and more importantly through the thickness of the film, needs to be accurate to about 0.002 of the refractive index value to provide a high quality device. An accurate control of this nature is not a feature of the processes employed to form an IC interlayer dielectric film.

SUMMARY OF THE INVENTION

An object of the invention is to minimise or to overcome these advantages. A further object of the invention is to provide an improved method of forming a cladding layer on a planar wave guide.

According to one aspect of the invention there is provided a method of providing a wave guide cladding layer on a substrate supporting a wave guide core, including heating the substrate to a first temperature so as to remove unstable products from the cladding, and further raising the temperature of the substrate until the cladding flows to provide a coherent coating on the core.

According to a further aspect of the invention there is provided a method of depositing a wave guide cladding layer on a planar wave guide, the method including preparing and annealing an arrangement having a layer of a silicon oxide, deposited on a silicon substrate, including heating the arrangement to a temperature between 700° C. and 900° C., then raising its temperature at a rate of between 5° to 15° C. per second to between 1100° and 1200° C., maintaining the arrangement at this temperature for 1 to 5 minutes, allowing the arrangement to cool at a rate of 5° to 15° C. per second to 600 to 800° C., and then allowing the arrangement to cool to room temperature.

Since the key feature for the improvements claimed in embodiments are related to understanding the causes of instability during heat treatment at high temperatures and judiciously choosing a low temperature initial anneal to remove instabilities in the very thick films, thus enabling us to attain higher temperatures within a few seconds, this invention is not restricted to any specific types of annealing equipment, but proposes selecting the temperature-time profiles for a given BPSG film. Resistively heated furnaces, with the required temperature zones, can also be used and would be the preferred method of annealing for devices fabricated on quartz substrates. The variations in the PECVD deposited BPSG compositions, with regard to phosphorous or boron content, may alter the initial annealing temperatures of 700° C. by ±50° C.

It is believed that removal of hydrogen, e.g. bonded hydrogen and water vapour, prior to raising the temperature to its highest value contributes to the successful annealing of the oxide layer. Following the annealing process another cladding layer may be applied, e.g. also using a PECVD process.

The preparation of the PECVD process may have involved the use of silane or nitrous oxide, as sources for silicon and oxygen, respectively, for the generation of the waveguide material. The dopant may be germania selected to provide a given refractive index. In some applications, the dopant may comprise a mixture of germania and boron.

The heating steps may either be carried out in a single stage or multistage furnace in the arrangement described above, or the heating may alternatively be provided by an adjacent bank of quartz or halogen lamps of adjustable intensity heating the waveguide directly, such heating by direct radiation being more rapid than that provided by a furnace.

The preferred materials for the waveguide are a substrate of silicon, a buffer layer thereon of undoped silica, a waveguide core of silica glass doped with germania (GeO2) and a cladding of boron and phosphorus doped glass of silica. The cladding layer is however not limited to borophosphosilicate glass, but may also comprise a combination of other materials such as germania, titania or arsenic so as to achieve low temperature flow properties and suitable optical properties. The germania doped core has a flowing temperature somewhat lower than that of the buffer due to the doping, but the cladding has an even lower flow temperature, so that it can flow without affecting the waveguide. The buffer layer and/or the core layer, preferably both, may be deposited by a PECVD process.

The required cladding layer thickness may be provided by a number of separate deposition stages, each deposited layer being separately annealed. Alternatively, the deposition can be carried out as a single step provided that the conformity of the film is adequately to avoid formation of voids and discontinuities. The annealing temperature of a single layer is similar to an equivalent multilayer structure.

In a preferred embodiment, the annealing process incorporates two annealing stages. In the first stage, a low temperature anneal at 700±50° C. removes undesirable contaminants such as bonded hydrogen and adsorbed water vapour. In the second stage, a high temperature anneal above the glass flow temperature ($T_f$) at 1100±50° C. consolidates the deposited material and allows the material to flow into any gaps in the substrate waveguide structure. The initial low temperature anneal allows the second higher anneal temperature to be reached rapidly thus reducing the overall process time.

BRIEF DESCRIPTION OF THE DRAWINGS

Arrangements illustrative of the invention will now be described, by way of example, with reference to the accompanying drawings, in which:

FIG. 8 illustrates for comparative purposes the insertion loss of a wavelength demultiplexer fabricated via a conventional process.

DESCRIPTION OF PREFERRED EMBODIMENT

Figure 1:
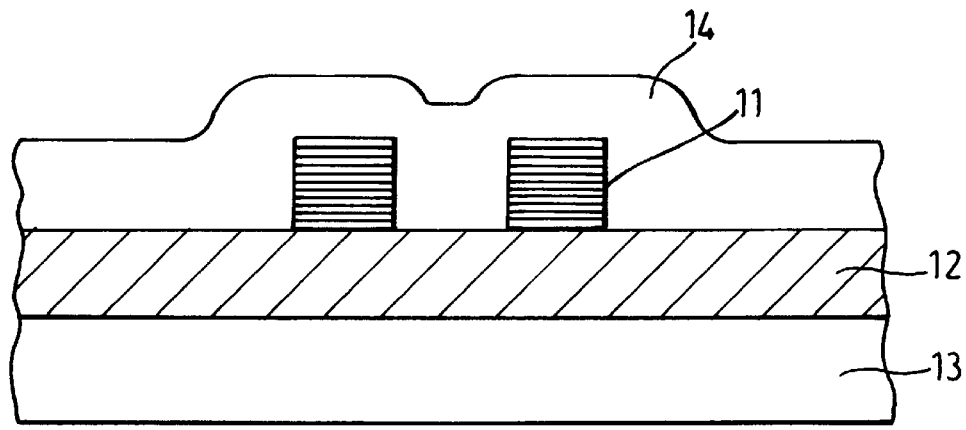
FIG. 1 shows in cross section a device structure to which the annealing process is applicable.

Referring to FIG. 1, the device structure comprises a closely spaced pair of waveguides 11 disposed on a layer of buffer oxide 12 on a silicon or quartz substrate wafer 13. A BPSG cladding layer 14 is provided over and between the waveguides 11. The cladding layer 14 is deposited from a PECVD process and is required to fill the narrow gap, which is typically of the order of 1 micron, between the waveguides. This is achieved by the annealing process described below.

Figure 2:
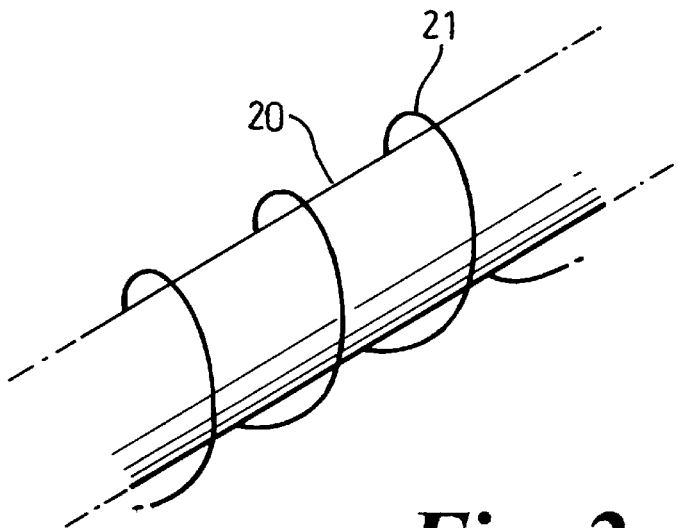
FIG. 2 shows diagrammatically and in perspective a furnace and a heating coil.

The rapid annealing, which is a feature of the arrangements being described, takes place in a furnace. The arrangements to be described employ a comparatively short annealing and densification programme time. A furnace illustrated diagrammatically in FIG. 2 has a refractory (quartz or SiC) cylindrical chamber 20 surrounded by an adjustable high current heating coil 21.

Figure 3:
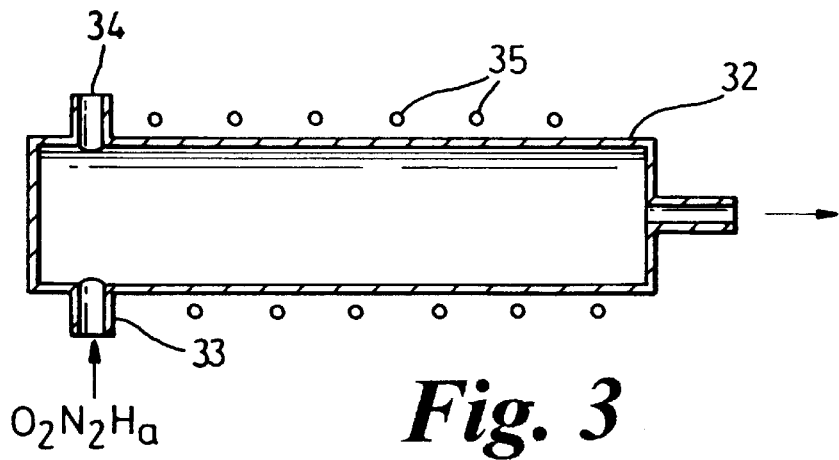
FIG. 3 shows diagrammatically and in a cross-sectional view a chamber heated by adjacent quartz halogen lamps.

FIG. 3 shows a preferred furnace arrangement in which a quartz chamber 32 has a feed 33 on one side for inert gases e.g. nitrogen or helium, or for oxygen for the easy removal of hydrogen, and an exit 34 at the other side for extracting the gases and enabling a continuous flow to be provided. The quartz chamber 32 does not absorb the radiation from a bank of quartz halogen lamps 35 adjacent the chamber 32 and it is possible to raise the temperature of objects in the chamber 32 very rapidly, as a result of radiations passing through the walls of the chamber 32 from the lamps 35.

Figure 4:
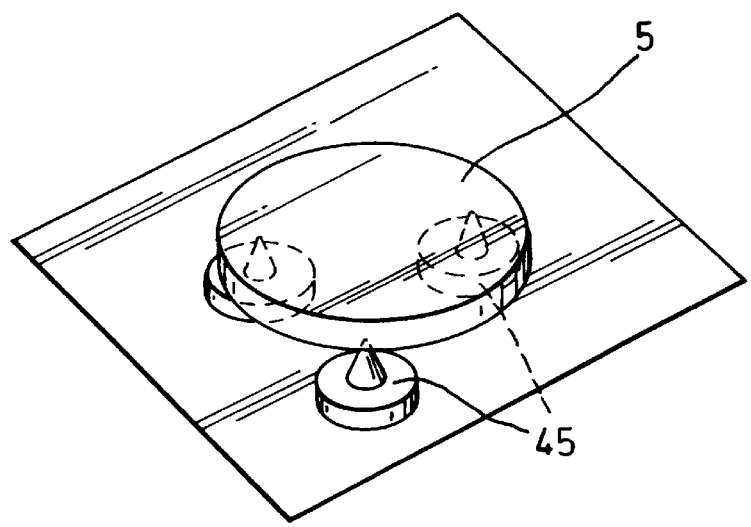
FIG. 4 and FIG. 5 show in diagrammatic perspective and side views respectively a typical mounting of a sample for heating by radiations in a chamber heated by halogen lamps.
Figure 5:
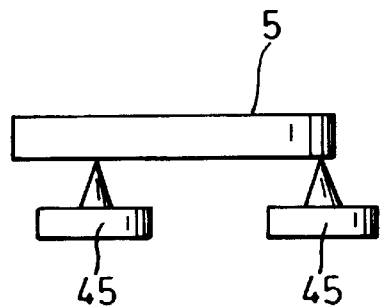

As shown in FIGS. 4 and 5, the wafer 5 may be suspended at three points by supports 45, or otherwise, in such a way that the supports 45 have little effect on the heating or cooling of the wafers 5. The thermal inertia of the wafers 5 of their supports 45 is kept at a minimum, and rapid warm-up and cooling of the wafers can be achieved by the control of the lamps 14a and of the gases introduced at 33. Many other types of heat insulated support for the wafers may be preferred.

Figure 6:
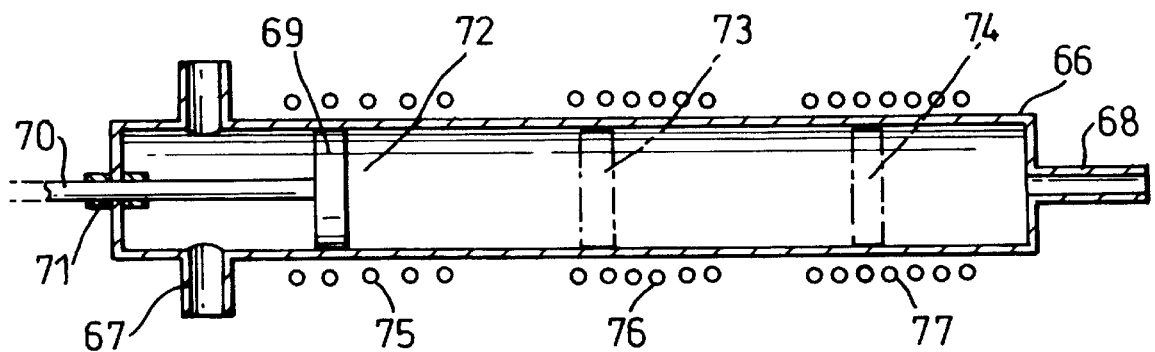
FIG. 6 shows a diagrammatic sectional view through a furnace heated in three successive compartments or regions to different temperatures.

In another method of carrying out the heating steps, which is particularly suitable for small batches of, for example, 20 or so wafers at a time, reference is now made of FIG. 6 which shows a three stage furnace 66. The furnace has an inlet 67 at one end suitable for the introduction of non-reactive or scavenging gases, an exhaust gas exit 18 at the other end, and a mobile wafer carrier 69 which can be moved along the furnace chamber 66, e.g. by means of a rod 70 passing through a seal 71, between differently heated regions. There may be a cool site 72, e.g. at 700° C., an intermediate temperature site 73 at, say, 850° C., and a hot site 74 at 1150° C., the differential heating being achieved by arranging three high current heating coils 75, 76 and 77 to be of differing powers or energizations. The wafers 5 may be transferred from one temperature environment to another in precise ways, which may be relatively slow, or rapid as required. The period for cooling down the wafers 5 can equally well be controlled precisely, and be long or short, as is required. The rapid annealing and densification of the deposited layer is achieved in a reliable manner, and the buffer layer of silica doped or undoped, may have been produced by a PECVD process, or otherwise. The refractive index of the cladding can be chosen appropriately for matching with the (slightly larger) refractive index of the underlying core resting on the buffer.

The previous depositions of the inner waveguide components and dopants may also have been deposited on the substrate by PECVD.

In a preferred embodiment, a 16 channel wavelength demultiplexer was fabricated having cladding layers of 6+5+5 microns thick BPSG film which layers were heated to 700° C. for 60 seconds, followed by 800° C. for 60 secs, followed by 900° C. for 60 secs, followed by 1000° C. for 60 secs, followed by 1100° C. for 60 seconds, followed by 1150° C. for 60 secs. The total time for the anneal was 19 minutes 45 seconds. This annealing was carried out on cladding layers deposited on silicon wafers with etched waveguide cores. Each of the cladding layers was separately annealed before the next cladding layer was deposited. The equipment used was a rapid thermal annealer (RTA), consisting of a quartz furnace, heated by multiple tungsten/halogen lamps. Silicon wafers, placed in the center of this quartz furnace, were purged by flowing nitrogen gas, before, during, and after annealing. The nitrogen gas may in some applications be replaced by helium, argon, oxygen or mixtures thereof. A flat graphite susceptor, of larger diameter than the wafer, was used to improve temperature uniformity across the wafer. After loading the wafer an initial purge period of 6 minutes occurs before heating the sample to ensure that all the air in the reactor is swept away by the purge gas flowing at 1 litre/min. The entire annealing process is controlled by a computer, with both the rate of temperature increase to the annealing temperatures and the rate of cooling down after anneal being 10° C./sec. In the processes described above, the properties of the rapidly annealed films of 16 microns thickness were found to be similar to those obtained by the prior proposed slow furnace annealing, with regard to the flowing conformity and index homogeneity requirements of planar waveguide devices, thus reducing the process time to anneal each cladding layer by a factor of 48.

Figure 7:
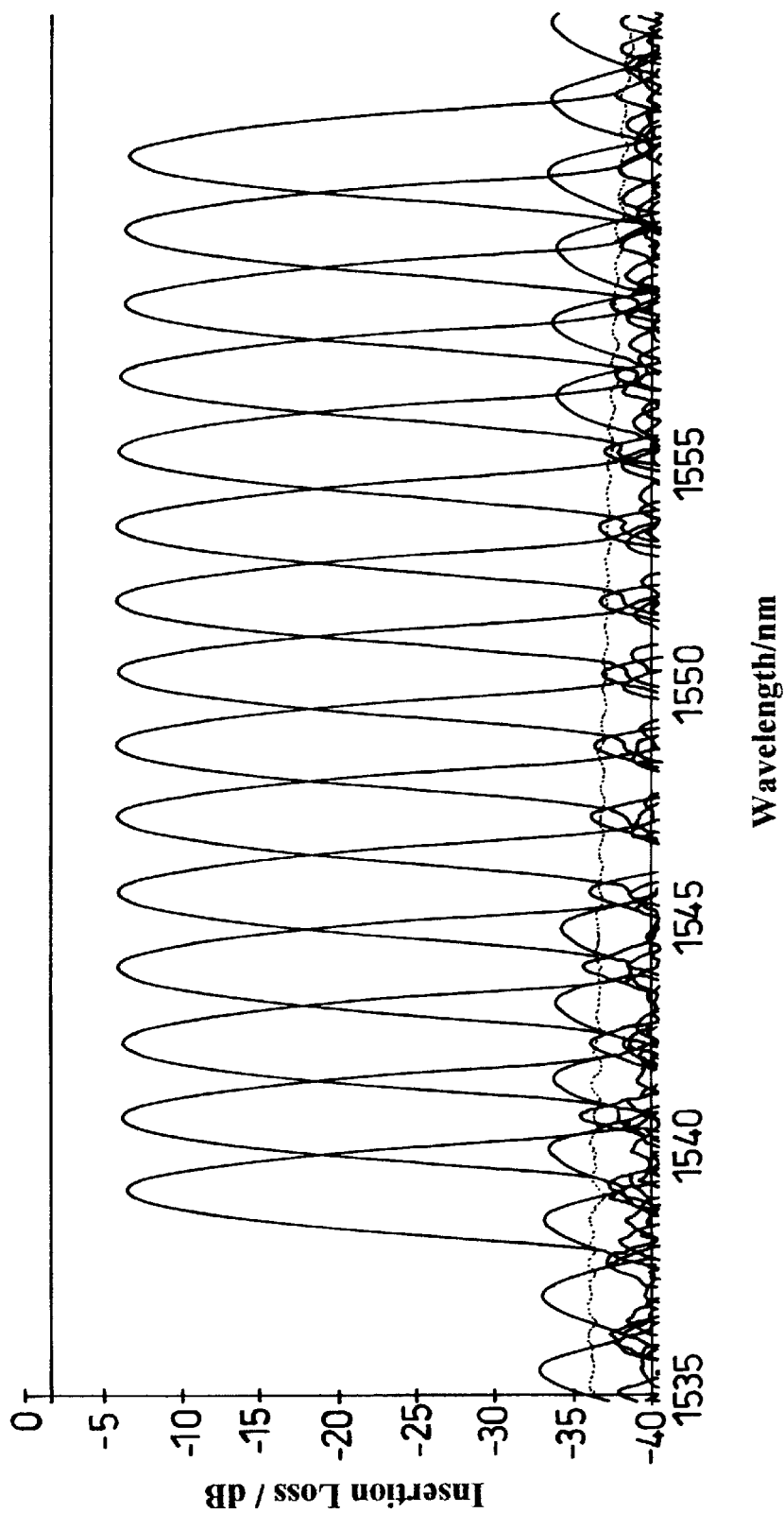
FIG. 7 illustrates the insertion loss of a wavelength demultiplexer fabricated via a process according to the invention.

Planar waveguide wavelength demultiplexers have been fabricated by using the above mentioned rapid annealing method for the cladding layer. The adjacent wavelength channel cross talk performance of the device so fabricated is shown in FIG. 7, and was found to be comparable to that obtained by conventional slow (48 hours) furnace anneals for the cladding. Comparable measurements to a similar device prepared using conventional slow annealing process are shown in FIG. 8. As can be seen from FIG. 7, the isolation between adjacent wavelength channels was found to be about −30 dB.

It will be understood that, although particular arrangements illustrative of the invention have been described, by way of example, variations and modifications thereof, as well as other embodiments, may be made within the scope of the protection sought by the appended claims.

We claim:

1. A method of depositing a waveguide cladding layer on a planar waveguide structure, the method consisting of preparing and annealing a structure comprising first and second planar waveguides adjacently disposed on a buffer layer of a silicon oxide, deposited on a silicon substrate, providing a glass surface cladding layer on the structure so as to cover said waveguides, heating the structure to a first temperature of 700° C.+/−50° C., then raising the temperature of the structure to a second temperature of 1100°+/−50° C., which second temperature is above the flow temperature ($T_f$) of the glass, maintaining the structure at this second temperature for a time sufficient to consolidate the glass and to allow the glass to flow into any gaps in the structure, and then allowing the structure to cool to room temperature.

2. A method as claimed in claim 1, wherein the step of heating to said first and second temperatures is provided by radiant heat from quartz halogen discharge lamps or other rapid thermal annealing (RTA) furnace.

3. A method as recited in claim 1, in which the glass cladding layer is deposited by a PECVD process.

4. A method as claimed in claim 1, wherein the step of heating to said first and second temperatures is provided by a furnace having a plurality of temperature zones.

* * * * *